(12) United States Patent
Sun et al.

(10) Patent No.: US 11,711,946 B2
(45) Date of Patent: Jul. 25, 2023

(54) SUBSTRATE HAVING A PRINTING AREA, LIGHT EMITTING DEVICE, AND METHOD FOR MANUFACTURING THE SUBSTRATE

(71) Applicant: BOE Technology Group Co., Ltd., Beijing (CN)

(72) Inventors: Hongda Sun, Beijing (CN); Qing Dai, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 85 days.

(21) Appl. No.: 17/052,575

(22) PCT Filed: Apr. 1, 2020

(86) PCT No.: PCT/CN2020/082745
§ 371 (c)(1),
(2) Date: Nov. 3, 2020

(87) PCT Pub. No.: WO2020/253319
PCT Pub. Date: Dec. 24, 2020

(65) Prior Publication Data
US 2021/0249487 A1     Aug. 12, 2021

(30) Foreign Application Priority Data

Jun. 20, 2019  (CN) .......................... 201910539861.X

(51) Int. Cl.
*H01L 27/32*     (2006.01)
*H10K 59/122*    (2023.01)
(Continued)

(52) U.S. Cl.
CPC .......... *H10K 59/122* (2023.02); *H10K 71/00* (2023.02); *H10K 71/135* (2023.02); *H10K 59/1201* (2023.02); *H10K 2102/351* (2023.02)

(58) Field of Classification Search
CPC .. H01L 27/3246; H01L 51/0005; H01L 51/56
(Continued)

(56) References Cited

U.S. PATENT DOCUMENTS 6,587,620 B2 * 7/2003 Koyama ................ B82Y 20/00
                                                257/E33.068
10,014,470 B2   7/2018 Song et al.
(Continued)

FOREIGN PATENT DOCUMENTS

CN      103682113 A    3/2014
CN      104992958 A   10/2015
(Continued)

OTHER PUBLICATIONS

First Office Action, including Search Report, for Chinese Patent Application No. 201910539861.X, dated Jan. 11, 2021, 15 pages.

*Primary Examiner* — Dzung Tran
(74) *Attorney, Agent, or Firm* — Westman, Champlin & Koehler, P.A.

(57) ABSTRACT

The present disclosure provides a substrate comprising a printing area, wherein the printing area comprises a flat surface and a plurality of separation structures projecting from the flat surface, wherein the plurality of separation structures divide the printing area into a plurality of micro-areas, and in each of the micro-areas, a circular region containing no separation structure has a maximum diameter between 5 μm and 10 μm. The present disclosure further provides a light emitting device comprising the substrate and a method for manufacturing the substrate.

13 Claims, 4 Drawing Sheets

(51) Int. Cl.
*H10K 71/00* (2023.01)
*H10K 71/13* (2023.01)
*H10K 59/12* (2023.01)
*H10K 102/00* (2023.01)

(58) Field of Classification Search
USPC .......................................................... 257/40
See application file for complete search history.

(56) References Cited

U.S. PATENT DOCUMENTS

| | | | | |
|---|---|---|---|---|
| 2008/0124574 | A1* | 5/2008 | Shoda | H01L 27/3283 |
| | | | | 428/690 |
| 2011/0025200 | A1* | 2/2011 | Rokuhara | B41M 3/003 |
| | | | | 313/504 |
| 2011/0223545 | A1* | 9/2011 | Pai | G03F 7/095 |
| | | | | 430/325 |
| 2014/0070179 | A1* | 3/2014 | Kim | H01L 51/5088 |
| | | | | 438/34 |
| 2016/0043150 | A1* | 2/2016 | Wang | H01L 27/127 |
| | | | | 257/40 |
| 2017/0279047 | A1 | 9/2017 | Song et al. | |
| 2019/0181203 | A1* | 6/2019 | Tan | H01L 27/3246 |
| 2020/0091254 | A1 | 3/2020 | Cui | |
| 2020/0303686 | A1 | 9/2020 | Zhao et al. | |

FOREIGN PATENT DOCUMENTS

| | | |
|---|---|---|
| CN | 106783939 A | 5/2017 |
| CN | 108075045 A | 5/2018 |
| CN | 109285865 A | 1/2019 |
| CN | 109616586 A | 4/2019 |
| CN | 110265563 A | 9/2019 |
| JP | 2010129345 A | 6/2010 |
| JP | 2010177154 A | 8/2010 |

* cited by examiner

SUBSTRATE HAVING A PRINTING AREA, LIGHT EMITTING DEVICE, AND METHOD FOR MANUFACTURING THE SUBSTRATE

This application is a Section 371 National Stage Application of International Application No. PCT/CN2020/082745, filed on Apr. 1, 2020, entitled "Substrate having a printing area, light emitting device, and method for manufacturing the substrate", which claims priority to Chinese Patent Application No. 201910539861.X, filed on Jun. 20, 2019, the disclosure of which are incorporated herein by reference in their entireties.

TECHNICAL FIELD

The present disclosure relates to the technical field of display device, in particular to a substrate having a printing area, a light emitting device, and a method for manufacturing the substrate.

BACKGROUND

Ink jet printing process is applied more and more in the manufacture of display devices, especially in the manufacture of a light emitting layer of a display device. As compared to large-scale evaporation deposition process, a light emitting layer formed by printing process has an advantage of remarkable improvement in color directivity, being capable of emitting light to a single pixel, and thus brings great progress in terms of colors of the image display of the display device.

Ink jet printing a light emitting layer comprises the following basic steps. First, a substrate on which a light emitting layer is to be ink jet printed is prepared. Generally, the substrate is provided with a printing area (i.e. an area for printing) and a non-printing area. On the area for printing, a light emitting layer is to be formed, and other elements such as a pixel may be further formed. For this purpose, the surface of the printing area may be provided with a pixel electrode. Further, the surface of the printing area may be surface-treated as needed, to adjust hydrophilicity or hydrophobicity, for example. The boundary of the printing area may be defined by a pixel definition layer. Second, an ink comprising a material for the light emitting layer is ink jet printed onto the printing area of the substrate as prepared, to form an ink droplet in the printing area. Subsequently, the solvent in the ink droplet is evaporated, thereby forming a required light emitting layer on the substrate.

For the homogeneity of light emitting, it is desired that the finally formed light emitting layer has a uniform thickness. There is still a need for an ink jet printed light emitting layer having a more uniform thickness.

SUMMARY

In one aspect, the present disclosure provides a substrate comprising a printing area, wherein the printing area comprises a flat surface and a plurality of separation structures projecting from the flat surface, wherein the plurality of separation structures divide the printing area into a plurality of micro-areas, and in each of the micro-areas, a circular region containing no separation structure has a maximum diameter between 5 µm and 10 µm.

Optionally, the micro-areas are adjacent to each other and the plurality of micro-areas is arranged in an array.

Optionally, each of the micro-areas is in communication with an adjacent micro-area.

Optionally, the separation structure has a height between 0.5 µm and 1 µm.

Optionally, the separation structure comprises a separation wall having a thickness of 1 µm or less.

Optionally, an orthographic projection of the separation structure on the substrate has a cross shape, and the separation structures divide the substrate into an array of planar square micro-areas.

Optionally, an orthographic projection of the separation structure on the substrate has a Y-shape, and the separation structures divide the substrate into an array of planar orthohexagonal micro-areas.

Optionally, the substrate is an array substrate, and comprises, at the separation structures, a source/drain electrode material pattern formed in the same layer as source/drain electrodes of the array substrate.

Optionally, the substrate is an array substrate, and comprises, at the separation structures, a metal pattern as a portion of a pixel electrode of the array substrate.

Optionally, the substrate is an array substrate, and the substrate further comprises an insulating layer above the separation structures.

In another aspect, the present disclosure provides a light emitting device, comprising:
the aforementioned substrate; and
a light emitting layer formed by ink jet printing in the printing area of the substrate.

Optionally, the entire light emitting layer has a thickness variation of less than 10 nm in a direction perpendicular to the substrate.

In yet another aspect, the present disclosure provides a method for manufacturing the aforementioned substrate, comprising:
forming the separation structures in the printing area of the substrate.

Optionally, the substrate is an array substrate and comprises source/drain electrodes, and the method comprises:
forming the source/drain electrodes of the substrate, and simultaneously forming in the printing area a source/drain electrode material pattern in the same layer as the source/drain electrodes; and
forming the separation structures at the source/drain electrode material pattern.

Optionally, the substrate is an array substrate and comprises a pixel electrode, and the method comprises:
forming the pixel electrode of the array substrate, wherein a metal pattern is formed in the pixel electrode; and
forming the separation structures at the metal pattern.

DETAILED DESCRIPTION

Figure 1A:
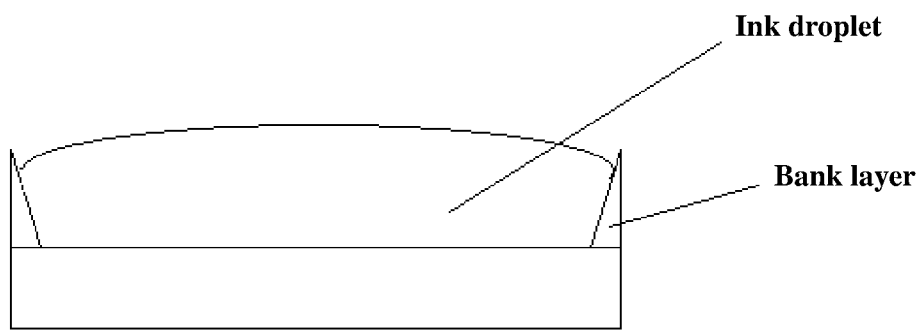
FIGS. 1a and 1b show a light emitting layer of related art in which a coffee ring is formed.

Currently, ink jet printing technique has been applied for forming a light emitting layer of light emitting device. In particular, an ink droplet comprising a material for light emitting layer is ink jet printed into a printing area of a substrate. The ink droplet spreads on the substrate, and is dried to form a light emitting layer after the solvent in the ink droplet has evaporated.

Inventors of the present application have found that in the case of ink jet printing a light emitting layer, the following problem will occur due to "coffee ring effect" during the spreading and drying process of the ink droplet to form the light emitting layer: in the printing area, the thickness of the light emitting layer formed in the periphery portion is much larger than that of the light emitting layer formed in the central portion, influencing the luminescence homogeneity of the device.

The coffee ring effect refers to phenomena that when a drop of coffee falls on a table, the particulate matters therein will leave a stain, and the color of the stain is not uniform, where the color of the periphery portion is darker than that of the central portion, forming a ring-shaped stripe.

One of the major reasons for the coffee ring effect is the liquid flow in the ink droplet. In the process of drying an ink droplet on a flat surface, because the solvent in the periphery portion of the ink droplet evaporates more quickly, the concentration of the solute or suspended matter in the periphery portion becomes higher than that in the central portion during the drying, that is, there is a concentration gradient of the solute or suspended matter inside the ink droplet. At this time, the solvent in the central portion of the ink droplet will migrate to the periphery portion, forming a compensation flow from the center to the periphery along the bottom of the ink droplet. Further, because of heat absorption by evaporation, the temperature of the periphery portion is lower than that of the central portion, that is, there is a temperature gradient in the ink droplet. Generally, the surface tension of an organic solvent decreases with increased temperature. Thus, the surface tension of the periphery portion of the ink droplet is high, while the surface tension of the central portion of the ink droplet is low. The surface tension gradient will result in a Marangoni flow from a low surface tension site to a high surface tension site along the bottom of the ink droplet. The compensation flow and the Marangoni flow migrate together with the solute or suspended matter, such that the solute or suspended matter accumulates at the periphery of the ink droplet. The combined effect of them is that a morphology with larger thickness at the periphery and smaller thickness at the center is formed after drying. Further, when the ink droplet is relatively large, a profile with a center slightly higher than its surrounding portion (but still lower than the periphery) may be obtained due to the pinning effect.

When the size of the ink droplet is relatively large, the difference in thickness between the periphery and the center is significant. When preparing a light emitting layer, the presence of the coffee ring effect will render the light emitting layer formed after drying to present a ring-shaped stripe, which in turn results in non-uniform luminescence, thereby influencing the display quality.

Figure 1B:
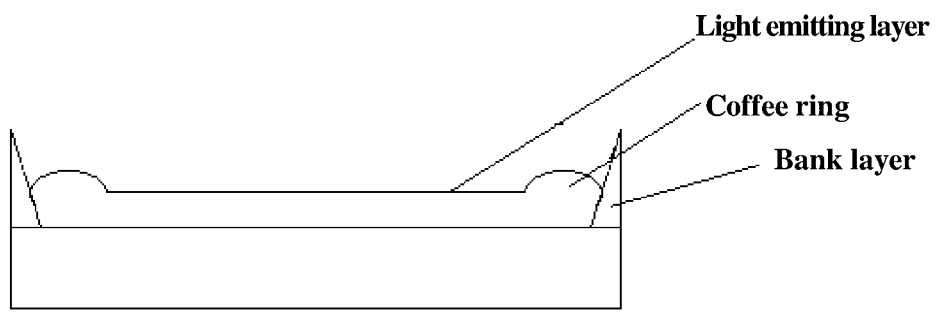

In related art, as shown in FIG. 1a, an ink droplet comprising a light emitting material is printed into a recess defined by a bank layer on a substrate. After drying, a light emitting layer as shown in FIG. 1b is formed, in which, due to the coffee ring effect, the periphery is thick, while the center is thin, influencing the homogeneity of the light emitting.

The inventors have surprisingly found that when the substrate beneath the large ink droplet in FIG. 1a is divided into several small areas by constructing separation structures on the substrate, the coffee ring effect will not occur if the size of the small area is small enough, thereby avoiding non-uniform thickness of the light emitting layer. Without being bounded to any theory, the presence of separation structures affects the flowing of the aforementioned compensation flow and Marangoni flow inside the ink droplet, and reduces the gradient and enrichment of the material for light emitting layer in the process of drying the ink droplet, thereby finally obtaining a light emitting layer with substantially uniform thickness.

The present disclosure provides a substrate on which a light emitting layer can be ink jet printed, comprising a printing area composed of a flat surface and a plurality of separation structures projecting from the flat surface, wherein in the printing area, a circular region containing no separation structure has a maximum diameter between 5 μm and 10 μm.

The substrate of the present disclosure may be a substrate on which a light emitting layer is to be ink jet printed. Any substrate is applicable in the present disclosure, as long as a light emitting layer can be directly formed on the substrate in the final display device. For example, the substrate may be an array substrate. For instance, the substrate may be a substrate with a pixel electrode such as a pixel anode on its top layer, and a light emitting layer is to be formed on the anode. The top layer may also be another functional layer capable of contacting with a light emitting layer, and is not limited in the present disclosure. The surface of the substrate may be subjected to a surface treatment, for example, a hydrophilic treatment or a hydrophobic treatment.

The substrate comprises a printing area. The printing area refers to an area where the ink jet printing is to be performed. The range of the printing area may be defined by a bank layer. The printing area comprises a flat surface and a plurality of separation structures projecting from the flat surface, wherein the plurality of separation structures projecting from the flat surface divide the printing area into a plurality of small areas (micro-areas), and the bottom of each of the small areas is the flat surface. The small areas are in communication with each other (for example, there is a gap between the separation structures forming the boundary of each small area). As such, after ink jet printing, ink droplets will contact the flat surface at the bottom, and the ink droplet liquids in the small areas are still in communication with each other. In other words, by means of the separation structures, the ink droplet liquids form a plurality of "small ink droplets", which are in communication with each other, in the plurality of "small areas" on the substrate.

The present disclosure is characterized in that a circular region containing no separation structure in the printing area has a maximum diameter between 5 μm and 10 μm. That is, at the bottom of each of the small areas, a largest inscribed circle, which is tangent to the separation structures defining the small area, is drawn, and the circle has a diameter between 5 and 10 μm. Thus, for each of the small ink droplets in the small areas, their spreading on the substrate will be limited by the separation structures, and there will not be any ink droplet spreading to a diameter of 10 μm or more. The inventors have found that when the spreading diameter of the ink droplet is not more than 10 μm, no significant coffee ring effect will occur, or the coffee ring effect does not occur to the extent of influencing the display homogeneity. Thus, the thickness of the light emitting layer formed on the substrate of the present disclosure is more uniform, resulting in higher luminescence homogeneity.

The maximum diameter of the above circular region is not less than 5 μm. When the maximum diameter of the circular region is too small, the spreading of the ink droplet in the small planar area will be influenced, and this will also influence the luminescence homogeneity of the light emitting layer.

The height of the separation structures or the thickness of the separation structures in a direction perpendicular to the substrate is preferably between 0.5 μm and 1 μm. If the height is too small, the limitation on the spreading of the small ink droplet is not sufficient. If the height is too large, it is not necessary, and on the other hand, the formation of a subsequent layer on the light emitting layer may be influenced.

Typically, the separation structures may be in the form of a separation wall, i.e., a thin plate shape projecting from the flat surface. The separation wall projects from the flat surface of the substrate, functioning to limit the spreading of a small ink droplet in a small area. The thickness of the separation wall is preferably 1 μm or less. Within this range, although the separation wall takes up some of the substrate area and there is no light emitting layer at the position of the separation wall, the luminescence homogeneity will not be visually influenced significantly because the thickness of the separation wall is very small relative to the material for the light emitting layer. However, if the thickness is too large, the separation wall itself will take up a too large substrate area, and thus the luminescence homogeneity and the overall luminance will be influenced. Smaller thickness of the separation wall is better. The minimum of the thickness is limited generally by its forming process.

Figure 2:
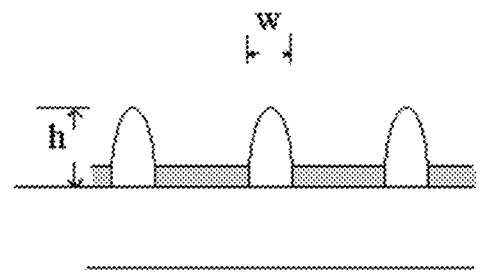
FIG. 2 shows a schematic sectional view of the separation structures according to an embodiment of the present disclosure.

FIG. 2 shows a schematic sectional view of the separation structures, where the width w and the height h of the separation structures are shown. The cross section of the separation structures as shown in this figure has a semielliptic shape or a semi-circle shape, but it can also have another shape, mainly depending on the manufacture process of the separation structures.

The height of a dried light emitting layer (designated in grey color) is smaller than the height of the separation structures. In the entire printing area, the light emitting layer is formed from one large ink droplet, and no coffee ring effect occurs during drying. Therefore, the height of the light emitting layer is substantially uniform in the area of the flat surface area.

Figure 3A:
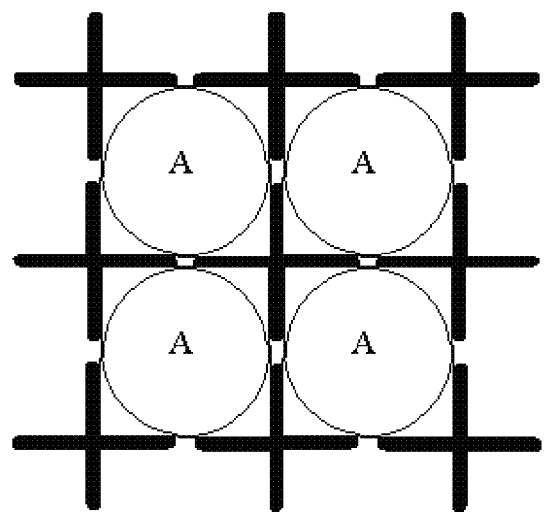
FIGS. 3a and 3b show the patterns of the separation structures according to the embodiments of the present disclosure and the inscribed circles thereof.
Figure 3B:
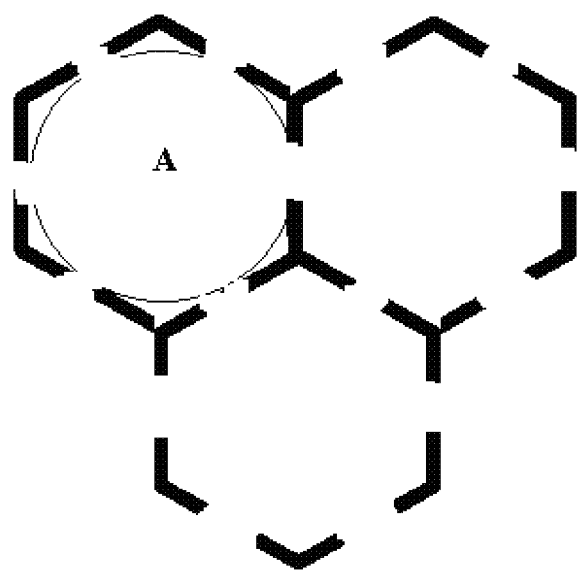

The separation structures define the largest diameter of the circle area of the flat surface, while allowing the ink droplets in the small areas to be in communication with each other. The separation structures are preferably arranged in a regular array, so as to facilitate the manufacture thereof and the control of the small areas. For example, as shown in FIG. 3a, an orthographic projection of the separation structure on the substrate has a cross shape, and the separation structures divide the substrate into an array of planar square microareas. Also, for example, as shown in FIG. 3b, an orthographic projection of the separation structure on the substrate has a Y-shape, and the separation structures divide the substrate into an array of planar orthohexagonal microareas. FIGS. 3a and 3b also show the circle regions A containing no separation structure. An orthographic projection of the separation structure may also have another shape, and this is not limited herein.

Figure 4:
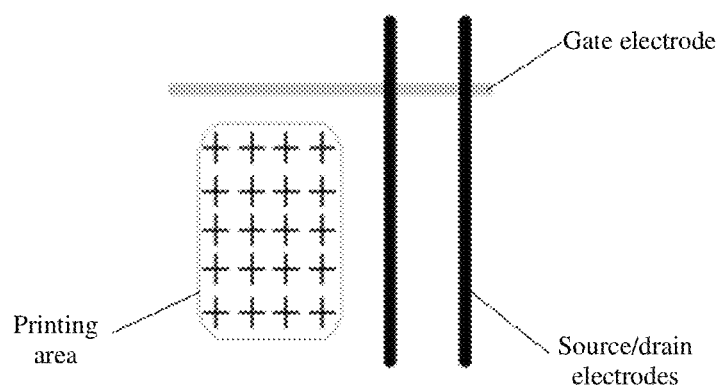
FIG. 4 shows a schematic structural diagram of a substrate with a circuit formed thereon.

The separation structure may sometimes be referred to as a separation wall, or a separation corner when the orthographic projection has a cross shape or a Y-shape as described above. FIG. 4 shows a schematic structural diagram of a substrate with a circuit formed thereon. The substrate is a TFT substrate, and the source/drain electrodes and the gate electrode of the control circuit are positioned around the printing area. In the printing area, there is an array of cross-shaped separation corners which define a plurality of small areas.

The separation structures may be formed by various processes, as long as the finally formed morphology meets the requirements for the present disclosure.

Figure 5:
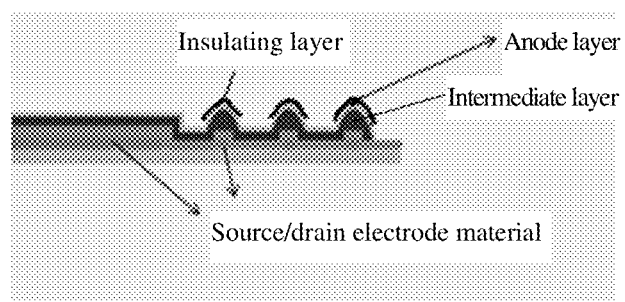
FIG. 5 shows a specific configuration of the separation structures according to an embodiment of the present disclosure.

FIG. 5 shows a specific configuration of the separation structures. The substrate may be an array substrate, and in the printing area, a source/drain electrode material pattern, which corresponds to a separation structure pattern, is formed in the same layer as the source/drain electrodes. That is, at sites of the separation structures, there is a source/drain electrode material pattern formed in the same layer as the source/drain electrodes of the array substrate. Subsequently, one or more layers are uniformly overlaid thereon in order. These layers may be an intermediate layer as same as the structure formed on the source/drain electrode layer. The intermediate layer may comprise an insulating layer, a planarization layer, or the like. It may be followed by a pixel electrode layer such as an anode layer, for example. There is also an insulating layer on the separation structure to insulate it from another pixel electrode layer such as a cathode layer subsequently formed on the light emitting layer. Desired separation structures can be obtained by controlling the shape, width and height of the originally projecting source/drain electrode material pattern. Generally, because of the presence of the subsequent intermediate layer, anode layer and insulating layer, the source/drain electrode material pattern may have a slightly larger height and a slightly smaller width than those of the finally formed separation structures. For example, when the separation structures have a height between 0.5 μm and 1 μm and a width of 1 μm or less, the source/drain electrode material pattern may have a height between 1 μm and 1.5 μm and a width between 200 nm and 500 nm. It should be noted that FIG. 5 is merely illustrative. For example, the insulating layer may be only formed on the top of the separation structures as shown in the figure, and may also cover the entire side surface of the separation structures, as long as it is ensured that the anode is insulated from the cathode.

Figure 6:
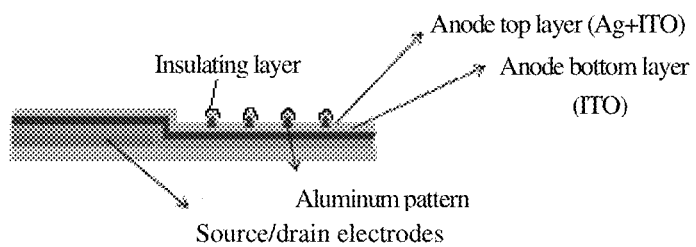
FIG. 6 shows another specific configuration of the separation structures according to an embodiment of the present disclosure.

FIG. 6 shows another specific configuration of the separation structures. In this configuration, no projections are formed in the printing area when forming the source/drain electrode layer. Projecting separation structures are not formed until the pixel electrode on the uppermost layer of the substrate is formed. Specifically, a metal pattern, as a portion of the pixel electrode, is formed at sites of the separation structures. For example, at sites of the separation structures in the printing area, an ITO/Al/Ag/ITO structure, as the projecting separation structure, is formed, and the remaining portion has an ITO/Ag/ITO structure. Desired separation structures are obtained by controlling the shape, width and height of the Al pattern. There is also an insulating layer on the separation structure to insulate it from another pixel electrode layer such as a cathode layer subsequently formed on the light emitting layer. Also, FIG. 6 is merely illustrative.

Of course, the separation structures of the substrate according to the present disclosure may also be formed by another process.

The present disclosure further provides a light emitting device comprising the substrate according to the present disclosure and a light emitting layer formed in the printing area of the substrate by ink jet printing. The structures of other parts of the light emitting device may be the same as those of an existing light emitting device. The light emitting device may be an OLED light emitting device, or a QLED light emitting device, for example. It may be a top emitting type or another type.

The present disclosure further provides a method for manufacturing the substrate, comprising forming the separation structures. The separation structures may be formed by any suitable process, such that a surface comprising a printing area composed of a flat surface and separation structures is formed.

In an embodiment, the substrate is an array substrate and comprises source/drain electrodes, and the method comprises: forming the source/drain electrodes of the array substrate, and simultaneously forming in the printing area a source/drain electrode material pattern in the same layer as the source/drain electrodes; and forming the separation structures at the source/drain electrode material pattern.

The source/drain electrode material pattern corresponds to the separation structures to be formed. Because of the formation of projecting source/drain electrode material pattern, the separation structures may be formed at the source/drain electrode material pattern. The formation of the separation structures at the source/drain electrode material pattern may be achieved by sequentially overlaying one or more layers in the printing area. One or more layers may be a planarization layer, an insulating layer or the like. The material thereof may be resin. One or more layers may also comprise a pixel electrode such as an anode which may comprise an ITO layer or the like.

In this case, in the area of the flat surface of the printing area, the surface layer of the substrate should be a pixel electrode layer such as an ITO anode layer, so as to form a light emitting element together with the light emitting layer thereon and another pixel electrode such as a cathode on the light emitting layer. However, at the separation structures of the printing area, the surface cannot also be the above ITO layer, otherwise a short circuit may occur between the surface and the cathode. Therefore, it is necessary to overlay an insulating layer at the separation structures. As an example, the insulating layer may be formed together with a pixel definition layer at the periphery of the printing area. The insulating layer may be formed by a conventional process in the art.

In another embodiment, the substrate is an array substrate and comprises a pixel electrode, and the method comprises:
forming the pixel electrode of the array substrate, wherein a metal pattern is formed in the pixel electrode; and
forming the separation structures at the metal pattern.

In a further embodiment, forming the pixel electrode comprises:
forming a bottom ITO layer;
forming a metal pattern in the printing area;
overlaying an Ag layer and a top ITO layer uniformly in the entire printing area, such that the separation structures are formed at the metal pattern, and the bottom ITO layer, the metal pattern, the Ag layer and the top ITO layer form the pixel electrode. The metal pattern may be an aluminum pattern, for example.

The metal pattern corresponds to the separation structures to be formed. Because a projecting metal pattern is added in the pixel electrode, a portion of the pixel electrode comprising the metal pattern will project from the flat surface, such that the separation structures can be formed at the metal pattern. Likewise, as described above, it is necessary for the surface at the separation structures to be insulated from the pixel electrode. Therefore, it is necessary to overlay an insulating layer at the separation structures. As an example, the insulating layer may be formed together with a pixel definition layer at the periphery of the printing area. The insulating layer may be formed by a conventional process in the art.

The present disclosure will be further described below with reference to the following examples.

According to an example of the present disclosure, a source/drain electrode layer is formed on an inorganic substrate (such as SiOx), and simultaneously, 36 cross-shaped source/drain electrode material patterns are formed in the same layer in a printing area with an area of 50*100 $\mu m^2$, by a stamping process. The source/drain electrode material patterns have a height of 1.2 $\mu m$, a width of 0.4 $\mu m$, and a spacing of 10.4 $\mu m$. Subsequently, on top of the source/drain electrode layer, a PVX (passivation layer) of inorganic material and a Resin layer of resin material with thicknesses of 0.2 $\mu m$ and 1 $\mu m$ respectively are formed by a process such as CVD and photolithography. The uppermost layer is an anode layer of ITO/Ag/ITO material. In the printing area, separation structures, having a height of 0.7 $\mu m$, a width of 0.8 $\mu m$ and a spacing of 10 $\mu m$, projecting from the bottom flat surface are formed. Subsequently, a pixel definition layer is formed at the periphery of the printing area, while an insulating layer is formed on the top of the separation structures. The final separation structures have a height of 0.8 $\mu m$.

10 $\mu l$ of ink is ink jet printed into the printing area. After drying, the light emitting layer has a height of about 30 nm and a height variation of no more than 10 nm.

Subsequently, a cathode layer is further formed on the light emitting layer to manufacture a top emitting light emitting device.

According to another example of the present disclosure, on a substrate with a resin layer having been formed thereon, an ITO layer is formed by a process such as deposition, photolithography, and etching. Subsequently, 36 cross-shaped aluminum wire patterns are formed in the printing area with an area of 50*100 $\mu m^2$ by a process such as deposition, photolithography, and etching. The cross-shaped aluminum wire patterns have a height of 0.7 $\mu m$, a width of 1 $\mu m$, and a spacing of 10.1 $\mu m$. An Ag layer and an ITO layer with thicknesses of 0.1 $\mu m$ and 0.05 $\mu m$ respectively are formed by a process such as deposition, photolithography, and etching. In the printing area, separation structures, having a height of 0.7 $\mu m$, a width of 1.1 $\mu m$ and a spacing of 10 $\mu m$, projecting from the bottom flat surface are formed. Subsequently, a pixel definition layer is formed at the periphery of the printing area, while an insulating layer is formed on the top of the separation structures. The final separation structures have a height of 0.8 $\mu m$.

10 $\mu l$ of ink is ink jet printed into the printing area. After drying, the light emitting layer has a height of about 30 nm and a height variation of no more than 10 nm.

As a comparative example of the present disclosure, on a planar substrate, a light emitting layer is formed in a planar printing area with an area of 50*100 $\mu m^2$ by ink jet printing 10 $\mu l$ of ink. The light emitting layer has a peripheral height of 50 nm and a central height of 10 nm, and a coffee ring having a width of 1.5 µm is formed at the periphery.

As compared to the comparative example, the light emitting layer formed on a substrate having separation structures according to the examples of the present disclosure has a uniform thickness, capable of providing more uniform luminescence.

Obviously, modifications and variations on the embodiments of the present disclosure can be made by those skilled in the art without departing from the spirit and scope of the present application. As such, if these modifications and variations fall within the scopes of the claims of the present application or equivalents thereof, the present application is intended to encompass these modifications and variations.

What is claimed is:

1. A substrate comprising a printing area, wherein the printing area comprises:
    a flat surface; and
    a plurality of separation structures projecting from the flat surface,
    wherein the plurality of separation structures divide the printing area into a plurality of micro-areas, wherein the micro-areas are adjacent to each other and the plurality of micro-areas are arranged in an array,
    wherein at a bottom of each of the micro-areas, a largest inscribed circle, which is tangent to the separation structures defining the micro-area, is drawn, and the diameter of the circle represents a maximum diameter of a circular region containing no separation structure in said micro-area, said maximum diameter being between 5 µm and 10 µm, and
    wherein said each of the micro-areas and all adjacent micro-areas form a central symmetrical structure centered on the inscribed circle center, wherein each of the micro-areas is in communication with every adjacent micro-area through a gap between the separation structures forming a boundary of these two micro-areas, and the gaps are evenly distributed around said each of the micro-areas and the number of the gaps on each boundary of said each of the micro-areas is the same.

2. The substrate according to claim 1, wherein the separation structure has a height between 0.5 and 1 µm.

3. The substrate according to claim 1, wherein the separation structure comprises a separation wall having a thickness of 1 µm or less.

4. The substrate according to claim 1, wherein an orthographic projection of the separation structure on the substrate has a cross shape, and the separation structures divide the substrate into an array of planar square micro-areas.

5. The substrate according to claim 1, wherein an orthographic projection of the separation structure on the substrate has a Y-shape, and the separation structures divide the substrate into an array of planar orthohexagonal micro-areas.

6. The substrate according to claim 1, wherein the substrate is an array substrate, and comprises, at the separation structures, a source/drain electrode material pattern formed in the same layer as source/drain electrodes of the array substrate.

7. The substrate according to claim 1, wherein the substrate is an array substrate, and comprises, at the separation structures, a metal pattern as a portion of a pixel electrode of the array substrate.

8. The substrate according to claim 1, wherein the substrate is an array substrate, and the substrate further comprises an insulating layer above the separation structures.

9. A light emitting device comprising:
    the substrate according to claim 1; and
    a light emitting layer formed by ink jet printing in the printing area of the substrate.

10. The light emitting device according to claim 9, wherein the entire light emitting layer has a thickness variation of less than 10 nm in a direction perpendicular to the substrate.

11. A method for manufacturing the substrate according to claim 1, comprising:
    forming a plurality of separation structures in a printing area of the substrate,
    wherein the printing area comprises a flat surface, and the plurality of separation structures project from the flat surface and divide the printing area into a plurality of micro-areas, wherein the micro-areas are adjacent to each other and the plurality of micro-areas are arranged in an array,
    wherein at a bottom of each of the micro-areas, a largest inscribed circle, which is tangent to the separation structures defining the micro-area, is drawn, and the diameter of the circle represents a maximum diameter of a circular region containing no separation structure in said micro-area, said maximum diameter being between 5 µm and 10 µm, and
    wherein said each of the micro-areas and all adjacent micro-areas form a central symmetrical structure centered on the inscribed circle center, wherein each of the micro-areas is in communication with every adjacent micro-area through a gap between the separation structures forming a boundary of these two micro-areas, and the gaps are evenly distributed around said each of the micro-areas and the number of the gaps on each boundary of said each of the micro-areas is the same.

12. The method according to claim 11, wherein the substrate is an array substrate and comprises source/drain electrodes, and said forming the separation structures in the printing area of the substrate comprises:
    at the same time of forming the source/drain electrodes of the array substrate, forming in the printing area a source/drain electrode material pattern in the same layer as the source/drain electrodes; and
    forming the separation structures at the source/drain electrode material pattern.

13. The method according to claim 11, wherein the substrate is an array substrate and comprises a pixel electrode, and said forming the separation structures in the printing area of the substrate comprises:
    forming in the printing area a metal pattern as a portion of the pixel electrode of the array substrate; and
    forming the separation structures at the metal pattern.

* * * * *